(12) United States Patent
Ferrer et al.

(10) Patent No.: US 12,063,046 B2
(45) Date of Patent: Aug. 13, 2024

(54) OSCILLATOR MONITORING CIRCUITS FOR DIFFERENT OSCILLATOR DOMAINS

(71) Applicant: Allegro MicroSystems, LLC, Manchester, NH (US)

(72) Inventors: Florencia Ferrer, Montevideo (UY); Lucas Intile, Buenos Aires (AR); Juan Manuel Cesaretti, Buenos Aires (AR); Nicolás Rigoni, Manchester, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 24 days.

(21) Appl. No.: 18/063,809

(22) Filed: Dec. 9, 2022

(65) Prior Publication Data
US 2024/0195424 A1    Jun. 13, 2024

(51) Int. Cl.
*H03L 7/00* (2006.01)
*H03D 13/00* (2006.01)
*H03K 3/12* (2006.01)
*H03L 7/099* (2006.01)

(52) U.S. Cl.
CPC ......... *H03L 7/0991* (2013.01); *H03D 13/001* (2013.01); *H03K 3/12* (2013.01)

(58) Field of Classification Search
CPC ....... H03L 7/0991; H03D 13/001; H03K 3/12
USPC .......................... 375/239, 354–357, 371–376
See application file for complete search history.

(56) References Cited

U.S. PATENT DOCUMENTS

| | | | | |
|---|---|---|---|---|
| 5,570,397 A | * | 10/1996 | Kubista | G06F 1/04 375/357 |
| 6,055,285 A | * | 4/2000 | Alston | G06F 5/10 375/372 |
| 6,314,150 B1 | * | 11/2001 | Vowe | H03L 7/095 331/DIG. 2 |
| 6,466,803 B1 | * | 10/2002 | Gardner | H03J 7/04 455/260 |
| 6,665,359 B1 | * | 12/2003 | Flake | G11B 20/10009 |
| 7,471,333 B2 | * | 12/2008 | Steimle | H04N 23/651 327/544 |
| 8,008,908 B2 | | 8/2011 | Doogue et al. | |
| 8,222,888 B2 | | 7/2012 | David et al. | |
| 8,688,404 B1 | * | 4/2014 | Levy | G06F 1/14 714/744 |
| 9,985,774 B2 | * | 5/2018 | Manohar | G06F 1/12 |

(Continued)

*Primary Examiner* — Emmanuel Bayard
(74) *Attorney, Agent, or Firm* — DALY, CROWLEY, MOFFORD & DURKEE, LLP (57) ABSTRACT

Clock monitors for circuits having a plurality of oscillators. The clock monitors produce an error indication when one oscillator is determined to be outside of a desired operating range or beyond a defined threshold with respect to a second oscillator. The clock monitors include a synchronizer configured to receive a clock signal from a first oscillator of the plurality of oscillators and synchronize the received clock signal with a second oscillator and to produce a synchronized clock signal. The clock monitors can include a counter configured to produce a count value based on synchronized clock signal. The clock monitors include comparison circuitry configured to receive the count value and produce an error indication when the count value is outside a predetermined range. The clock monitors may be used to ensure correct clock operation for different transition scenarios, e.g., turning on or off a certain clock or power domain.

34 Claims, 5 Drawing Sheets

(56) References Cited

U.S. PATENT DOCUMENTS

| | | | | |
|---|---|---|---|---|
| 10,790,837 B1* | 9/2020 | Azam | ............... | H03K 3/011 |
| 10,839,920 B2 | 11/2020 | Cesaretti et al. | | |
| 10,852,161 B2 | 12/2020 | Cesaretti et al. | | |
| 2001/0043098 A1* | 11/2001 | Locker | ............... | G06F 1/12 |
| | | | | 327/156 |
| 2004/0223564 A1* | 11/2004 | Adkisson | ............... | G06F 1/12 |
| | | | | 375/354 |
| 2006/0114983 A1* | 6/2006 | Fink | ............... | H03K 7/06 |
| | | | | 375/239 |
| 2007/0280396 A1* | 12/2007 | Liu | ............... | G06F 1/12 |
| | | | | 375/372 |
| 2010/0172455 A1* | 7/2010 | McShea | ............... | H03L 7/087 |
| | | | | 375/362 |
| 2010/0271525 A1* | 10/2010 | Takahashi | ............... | H04N 25/75 |
| | | | | 341/169 |
| 2012/0110364 A1* | 5/2012 | Bhargava | ............... | G06F 1/12 |
| | | | | 713/400 |
| 2022/0091652 A1* | 3/2022 | Augustine | ............... | H03K 19/017509 |
| 2023/0403017 A1* | 12/2023 | Zanchi | ............... | H03L 7/085 |

* cited by examiner

OSCILLATOR MONITORING CIRCUITS FOR DIFFERENT OSCILLATOR DOMAINS

BACKGROUND

Synchronous digital circuits typically utilize clocks to control and synchronize the time of operation of the various circuit components. The digital circuits are typically designed so that signal inputs and outputs flow correctly and with desired timing, to and from the various circuit elements, to produce a desired circuit performance. Assuming correct timing, then all of the circuit elements can operate together to produce the desired result, e.g., one or more desired circuit output signals in response to one or more input signals.

Some digital circuits, including some integrated circuits, e.g., microcontrollers, can employ multiple different clocks operating at different clock speeds or frequencies of oscillation. Each clock might control the timing of operations within some subset of the circuit elements These subsets of elements are often called "clock domains." Multiple clock domains might be used, for example, where some portions of the circuit perform high frequency measurements or high speed signal processing. These portions of the system might require a relatively high frequency clock. Other portions of the circuit might perform relatively low frequency control functions and therefore be implemented with less expensive logic clocked with a lower frequency clock. Higher-frequency domains typically consume more power than lower-frequency domains.

Some digital circuits may be used in applications that are subject to safety requirements. For example, some electronic circuits may be used for automotive systems that are required to conform to certain safety specifications such as the Automotive Safety Integrity Level (ASIL) risk classification defined by the ISO 26262 standard ("Functional Safety for Road Vehicles"). Conforming to certain safter requirements, e.g., ASIL requirements, can create a need for high circuit reliability.

One of the critical points of a typical synchronous digital circuit is performance of the clock or clocks used in the circuit. Circuit layout is designed assuming certain assumptions regarding the clock's frequency, e.g., that clock timing signals will be within a small error range of the clock's nominal frequency. If such assumptions are not met, the circuit behavior may not be guaranteed and may fail for the intended purposes, including conformance with the given safety requirements.

SUMMARY

An aspect of the present disclosure includes a clock monitor for a monitored circuit having a plurality of oscillators. The clock monitor may include means for synchronization configured to receive a clock signal from a first oscillator of the plurality of oscillators and synchronize the received clock signal with a second oscillator of the plurality of oscillators and to produce a synchronized clock signal. The clock monitor may include a counter configured to produce a count value based on synchronized clock signal, and comparison circuitry configured to receive the count value and produce an error indication when the count value is outside a predetermined range.

Implementations may include one or more of the following features. The clock monitor may include a first oscillator that has a lower operating frequency than the second oscillator. The comparison circuitry may include a comparator configured to compare the count value to upper and/or lower threshold values and to determine whether the count value indicates a frequency error. The comparison circuitry can be configured to detect the lower frequency clock being stuck. The comparison circuitry can be configured to detect the frequency difference between the two clocks being outside of a predetermined range. The clock monitor may include an edge detector configured to detect transitions between one digital signal state and another state of the synchronized clock signal. The edge detector may include a rising-edge detector. The first oscillator can have a higher operating frequency than the second oscillator. The first oscillator can be configured to run at a nominal frequency of about 2 MHz and the second oscillator can be configured to run at a nominal frequency of about 16 MHz, where the means for synchronization is disposed in a domain of the second oscillator. The first oscillator can be configured to run at a nominal frequency of about 250 kHz and the second oscillator can be configured to run at a nominal frequency of about 2 MHz, where the means for synchronization can be disposed in a domain of the second oscillator. The first oscillator can be configured to run at a nominal frequency of about 250 kHz and the second oscillator can be configured to run at a nominal frequency of about 16 MHz, where the means for synchronization can be disposed in a domain of the second oscillator. The first oscillator can be configured to run at a nominal frequency of about 250 kHz and the second oscillator can be configured to run at a nominal frequency of about 16 MHz, where the means for synchronization can be disposed in a domain of the second oscillator. The comparison circuitry may include a finite state machine (FSM). The first oscillator can be configured to run at a nominal frequency of about 2 MHz and the second oscillator can be configured to run at a nominal frequency of about 250 kHz, where the means for synchronization can be disposed in the domain of the second oscillator. The means for synchronization may include a plurality of flip-flops configured in series. The means for synchronization may include a mux synchronizer. The means for synchronization may include a toggle synchronizer. The means for synchronization may include a dual-clock FIFO synchronizer. The upper and lower thresholds each may include multiple (e.g., a pair of) different thresholds. The plurality of oscillators can be disposed in an integrated circuit. The comparison circuitry can be configured to implement a predetermined range including upper and lower thresholds.

A further aspect of the present disclosure includes a clock monitor circuit for detecting oscillator frequency error in an integrated circuit including a plurality of oscillators. The clock monitor circuit can include a synchronizer configured to receive a clock signal from a first oscillator of the plurality of oscillators and synchronize the received clock signal with a second oscillator of the plurality of oscillators and to produce a synchronized clock signal. The clock monitor circuit can include a counter configured to produce a count value based on synchronized clock signal, and comparison means configured to receive the count value and produce an error indication when the count value is outside a predetermined range.

Implementations may include one or more of the following features. The clock monitor circuit may include a first oscillator that has a lower operating frequency than the second oscillator. The comparison means may include a comparator configured to compare the count value to upper and/or lower threshold values, to determine whether the count value indicates a frequency error. The comparison circuitry can be configured to detect the lower frequency clock being stuck. The comparison circuitry can be configured to detect the frequency difference between the two clocks being outside of a predetermined range. The clock monitor circuit may include an edge detector configured to detect transitions between one digital signal state and another state of the synchronized clock signal. The edge detector may include a rising-edge detector. The first oscillator can have a higher operating frequency than the second oscillator. The first oscillator may be configured to run at a nominal frequency of about 2 MHz and the second oscillator may be configured to run at a nominal frequency of about 16 MHz, where the synchronizer can be disposed in a domain of the second oscillator. The first oscillator may be configured to run at a nominal frequency of about 250 kHz and the second oscillator may be configured to run at a nominal frequency of about 2 MHZ, where the synchronizer can be disposed in a domain of the second oscillator. The first oscillator may be configured to run at a nominal frequency of about 250 kHz and the second oscillator may be configured to run at a nominal frequency of about 16 MHz, where the synchronizer can be disposed in a domain of the second oscillator. The first oscillator can be configured to run at a nominal frequency of about 250 kHz and the second oscillator can be configured to run at a nominal frequency of about 16 MHz, where the synchronizer can be disposed in a domain of the second oscillator.

The comparison means may include a finite state machine (FSM). The first oscillator can be configured to run at a nominal frequency of about 2 MHz and the second oscillator can be configured to run at a nominal frequency of about 250 kHz, where the synchronizer can be disposed in the domain of the second oscillator. The synchronizer may include a plurality of flip-flops configured in series. The synchronizer may include a MUX synchronizer. The synchronizer may include a toggle synchronizer. The synchronizer may include a dual-clock FIFO synchronizer. The comparison means can be configured to implement a predetermined range including upper and lower thresholds. The upper and lower thresholds each may include a pair of different thresholds. The clock monitor circuit may include a microcontroller.

Other embodiments of the aspects and examples described may include corresponding computer systems, apparatus, and computer programs recorded on one or more computer storage devices, each configured to perform the actions of the methods as described herein. A computer system of one or more computers can be configured to perform particular operations or actions, as described herein, by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the operations or actions.

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the present disclosure, which is susceptible of many embodiments. What follows is illustrative, but not exhaustive, of the scope of the present disclosure.

BRIEF DESCRIPTION OF THE DRAWINGS

The manner and process of making and using the disclosed embodiments may be appreciated by reference to the figures of the accompanying drawings. It should be appreciated that the components and structures illustrated in the figures are not necessarily to scale, emphasis instead being placed upon illustrating the principals of the concepts described herein. Furthermore, embodiments are illustrated by way of example and not limitation in the figures, in which.

DETAILED DESCRIPTION

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the inventive subject matter. The subject technology is susceptible of many embodiments. What follows is illustrative, but not exhaustive, of the scope of the subject technology.

An aspect of the present disclosure is directed to clock monitors for circuits having a plurality of oscillators. The clock monitors can produce an error indication, e.g., warning or flag indicating oscillator frequency error ("OFE"), when one oscillator is determined to be outside of a desired operating range or beyond a defined threshold with respect to a second oscillator. The clock monitors can include a synchronizer (a.k.a., means for synchronization) configured to receive a clock signal from a first oscillator of the plurality of oscillators and synchronize the received clock signal with a second oscillator of the plurality of oscillators and to produce a synchronized clock signal. The clock monitors can include a counter configured to produce a count value based on synchronized clock signal. The clock monitors can also include comparison circuitry (a.k.a., comparison means) configured to receive the count value and produce an error indication when the count value is outside a predetermined range. The clock monitors may be used to ensure correct clock operation for different transition scenarios, e.g., turning on or off a certain domain such as when all or a portion of an IC exits or enters a sleep mode. Examples of clock monitors can be implemented as separate circuits or integrated circuits, or as part of larger circuits or integrated circuits.

In example circuits according to the present disclosure, one or more clock monitors can be used with or included in integrated circuits (ICs) having multiple (e.g., three) different oscillators (e.g., 250 kHz, 2 MHz and 16 MHZ) that work on different power domains. One or more oscillators (e.g., 2 MHz and 250 kHz) can be used for a low-power domain (e.g., an "always on" domain) and one or more oscillators (e.g., 16 MHz clock) can be used for a high-power (e.g., full-power) domain, which can be turned off, or set to a "sleep" power mode, at times to decrease power consumption.

An example circuit according to the present disclosure can include five different clock monitors: a first monitor implementing a 2 MHz vs 16 MHz monitor, which may operate at desired time, e.g., checked every time at start-up or after a low-power mode (LPM) to full-power (FP) transition); a second monitor implementing a 2 MHz vs 250 kHz monitor (e.g., checked every time at start-up or after a LPM—FP transition); a third monitor implementing 16 MHz vs 250 kHz monitor in FP domain; a fourth monitor implementing a 250 kHz vs 16 MHz monitor in a LP domain during full power (FP); and, a fifth monitor implementing a 2 MHz vs 250 kHz, e.g., during low-power mode (LPM). The clock monitors can each be set or programmed to produce an error indication, e.g., fault, warning, flag, etc., in the event a threshold or operational range is exceeded. In some examples, the error on the monitors can be set depending on the clock tolerance (e.g., 10%, 20%, etc.), which can be defined in a programmable field (e.g., an OFE_FAULT_THR field), a memory location, and/or code. Of course, while five particular monitors are described, other examples and embodiments of clock monitor circuits according to the present disclosure can include fewer or more monitors and the monitors may be configured to monitor clocks having different speeds (frequencies of oscillation).

Figure 1:
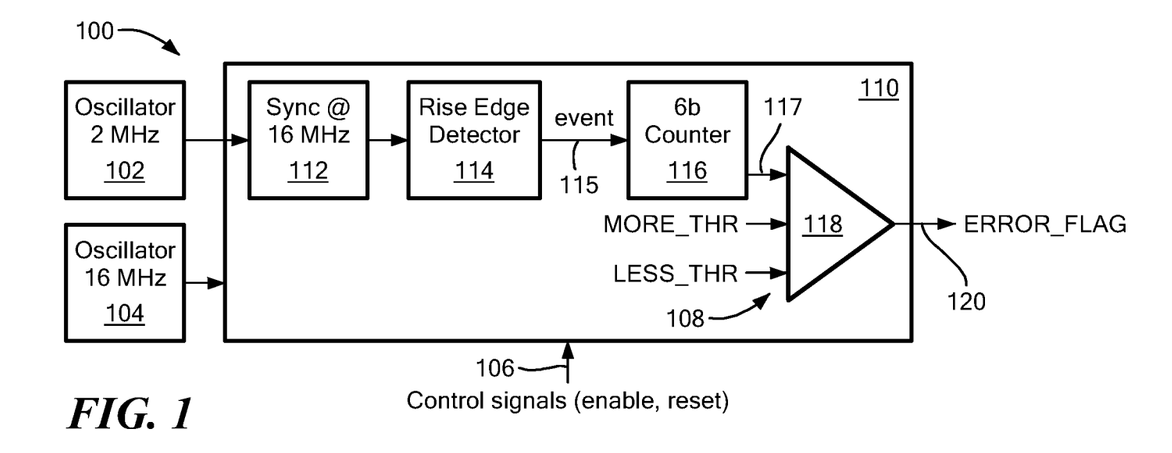
FIG. 1 is a diagram of an example clock monitor circuit implementing a 2 MHz monitor on a 16 MHz domain, in accordance with the present disclosure.

FIG. 1 is a diagram of an example clock monitor circuit 100 implementing a 2 MHZ monitor on a 16 MHz domain, in accordance with the present disclosure. Circuit 100 can include a first oscillator (clock) 102 configured for oscillation at a first frequency (e.g., 2 MHz) and a second oscillator (clock) 104 configured for oscillation at a second frequency, e.g., 16 MHz. Clock monitor circuit (a.k.a., "clock monitor") 100 can further include a synchronizer (a.k.a., means for synchronization) 112. As shown, synchronizer 112 may be disposed within or operating at the frequency of the domain of second oscillator 104. In some examples, synchronizer (means for synchronization) 112 can include a MUX synchronizer, a toggle synchronizer, and/or a dual-clock FIFO synchronizer. In the example, the 2 MHz clock 102 is synchronized @16 MHz, i.e., to the 16 MHz domain. While certain frequencies of oscillations are described for the first and second oscillators 102, 104, the oscillators may have different frequencies of operation in other examples.

Circuit 100 may further include an edge detector, e.g., rising-edge detector 14, that is connected to synchronizer 112 and configured to produce an output 115 indicating when a rising-edge is detected on an input signal (waveform). While a rising-edge detector 114 is described, in other examples an edge detector may include a falling-edge detector. Circuit 100 may include a counter 116, e.g., a six-bit (6b) counter, configured to receive the output 115 of the rising-edge detector and produce a corresponding count value 117 as an output. While counter 116 is described as a six-bit (6b) counter, counter 116 may have a different size (e.g., 8-bit, 7-bit, 4-bit, 10-bit, etc.) in other examples and/or applications. Clock monitor circuit 100 can also include comparator 118 that is configured to receive the count value 117 from counter 116 and compare the count value 117 to one or more thresholds 108, e.g., a first threshold (indicated by "LESS_THR") and second threshold (indicated by "MORE_THR") corresponding to lower and higher threshold values, respectively.

In an example of operation of monitor circuit 100, the 2 MHz clock (oscillator) 102 can be turned on for an initial time or during enabling window, e.g., for 50 us after a memory (e.g., EEPROM) reload is completed for the monitored circuit. The initial time or enabled window may be varied and may have different values in other examples. Such a memory reload may occur, e.g., after initial start-up and/or after every transition from low-power mode (LPM) to full power (FP). The 2 MHz oscillator 102 can be checked for a specified time, e.g., 12 µs, after a specified time, e.g., 8 µs, of being turned on to avoid transient issues. The 2 MHz clock 102 can be synchronized ("synced") in (or to) the 16 MHz domain (e.g., as indicated by CLK_2M_SYNC). The 6-bit counter 116 on the 16 MHz domain can be incremented with every rising edge of the 2 MHZ clock 102. For the example indicated, the target count can be 24 for a check occurring during a 12 us window. After the 2 MHz clock 102 is turned off the count is checked against the lower threshold, e.g., COUNTER_LESS (22 or 19), and the higher threshold, e.g., COUNTER_MORE (26 or 29), which can be set depending on a setting of a register, e.g., an OFE_FAULT_THR register. This operation can catch or detect errors when the 2 MHz clock is stuck and also any clock difference between the 16 MHz clock 104 and 2 MHz clock 102 larger than the specified thresholds, e.g., at 10% or 20% (depending on set-up).

Figure 2:
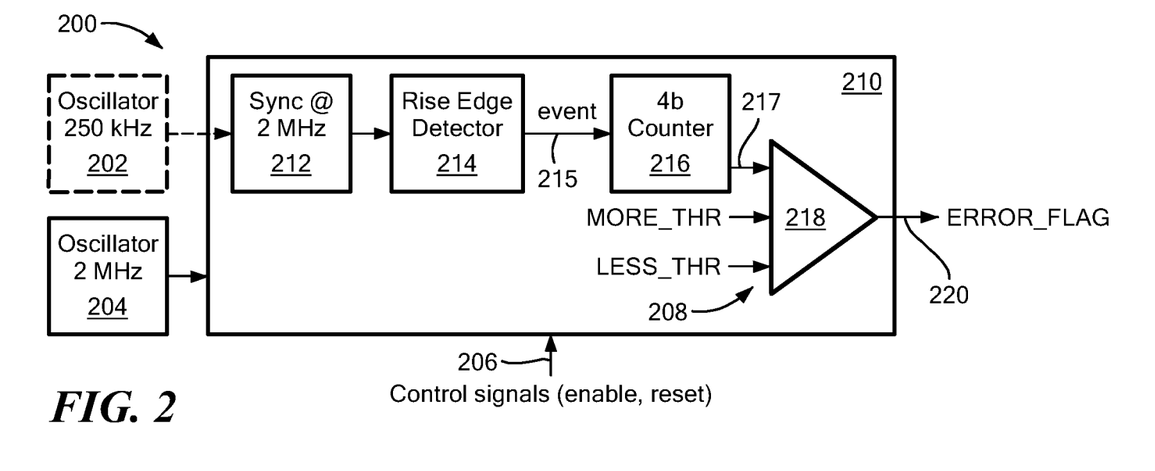
FIG. 2 is a diagram of an example clock monitor circuit implementing a 250 kHz monitor on a 2 MHz domain, in accordance with the present disclosure.

FIG. 2 is a diagram of an example clock monitor circuit 200 implementing a 250 kHz monitor on a 2 MHz domain, in accordance with the present disclosure. In some examples, circuit 200 can be implemented in a low-power fast-clock functional domain block of a microcontroller or other processor integrated circuit. Circuit 200 can include a first oscillator 202 configured for oscillation at a first frequency (e.g., 250 kHz) and a second oscillator 204 configured for oscillation at a second frequency, e.g., 2 MHz. Clock monitor circuit (a.k.a., "clock monitor") 200 can further include a synchronizer (a.k.a., means for synchronization) 212. As shown, synchronizer 212 may be disposed within or operating at the frequency of the domain of second oscillator 204. In some examples, synchronizer (means for synchronization) 212 can include a MUX synchronizer, a toggle synchronizer, and/or a dual-clock FIFO synchronizer. In the example, the 250 kHz clock 202 is synchronized @2 MHz, i.e., to the 2 MHz domain. In some examples, circuit 200 can be used for an "awake" state during a low-power mode (LPM). Of course, while certain frequencies of oscillations are described for the first and second oscillators 202, 204, the oscillators may have different frequencies of operation in other examples.

Circuit 200 may further include a rising-edge detector 214 that is connected to synchronizer 212 and configured to produce an output 215 indicating when a rising-edge is detected on an input signal (waveform). While a rising-edge detector 214 is described, in other examples/embodiments an edge detector may include a falling-edge detector. Circuit 200 may include a counter 216, e.g., a four-bit (4b) counter, configured to receive the output 215 of the rising-edge detector and produce a corresponding count value 217 as an output. While counter 216 is described as a four-bit (4b) counter, counter 216 may have a different size (e.g., 8-bit, 7-bit, 6-bit, 10-bit, etc.) in other examples and/or applications. Clock monitor circuit 200 can also include comparator 218 that is configured to receive the count value 217 from counter 216 and compare the count value 217 to one or more thresholds 208, e.g., a first threshold (indicated by "LESS_THR") and second threshold (indicated by "MORE_THR") corresponding to lower and higher threshold values, respectively.

In an example of operation of circuit 200, the 250 kHz clock can be synced in the 2 MHz domain. Counter 216 can include a 4-bit counter on the 2 MHz domain. Counter 216 can be incremented with every rising edge of the 250 kHz clock. For the example, the target count can be 10 for a check occurring for a 40 us window. After the 2 MHz clock is turned off the count is checked against COUNTER_LESS (e.g., shown as 9 or 8) and COUNTER_MORE (e.g., shown as 11 or 12) which can be set according to a specified threshold, e.g., OFE_FAULT_THR. This operation can catch or detect when the 2 MHz clock is stuck, and any clock difference between the 2 MHZ clock 204 and the 250 kHz clock 202 larger than the specified thresholds, e.g., shown as 10% or 20%, depending on set-up.

Figure 3:
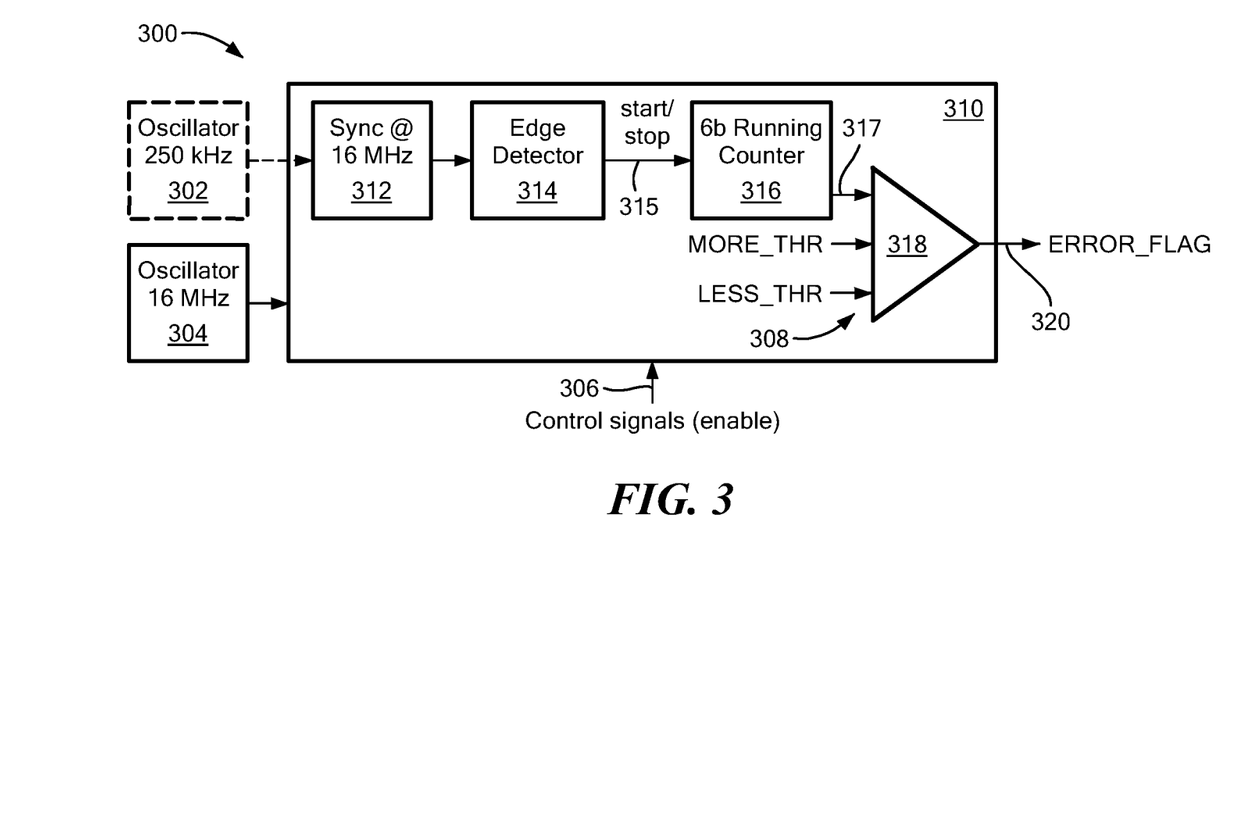
FIG. 3 is a diagram of an example clock monitor circuit implementing a 250 kHz monitor on a 16 MHz domain, in accordance with the present disclosure.

FIG. 3 is a diagram of an example clock monitor circuit 300 implementing a 250 kHz monitor on a 16 MHz domain, in accordance with the present disclosure. Circuit 300 can include a first oscillator 302 configured for oscillation at a first frequency (e.g., 250 kHz) and a second oscillator 304 configured for oscillation at a second frequency, e.g., 16 MHz. Clock monitor circuit (a.k.a., "clock monitor") 300 may also include a synchronizer (a.k.a., means for synchronization) 312. As shown, synchronizer 312 may be disposed within or operating at the frequency of the domain of second oscillator 304. In some examples, synchronizer (means for synchronization) 312 can include a MUX synchronizer, a toggle synchronizer, and/or a dual-clock FIFO synchronizer. In the example, the 250 MHz clock is synchronized @16 MHz, i.e., to the 16 MHz domain. In some examples, clock monitor circuit may be checked periodically, e.g., every clock cycle of the 250 kHz clock 302. Of course, while certain frequencies of oscillations are described for the first and second oscillators 302, 304, the oscillators may have different frequencies of operation in other examples.

Circuit 300 may further include an edge detector, e.g., a rising-edge detector, 314 that is connected to synchronizer 312 and configured to produce an output 315 indicating when a rising-edge is detected on an input signal (waveform). While a rising-edge detector 314 is described, in other examples an edge detector may include a falling-edge detector. Circuit 300 may include a counter 316, e.g., a six-bit (6b) counter, configured to receive the output 315 of the rising-edge detector and produce a corresponding count value 317 as an output. While counter 316 is described as a six-bit (6b) counter, counter 316 may have a different size (e.g., 8-bit, 7-bit, 4-bit, 10-bit, etc.) in other examples and/or applications. Clock monitor circuit 300 can also include comparator 318 that is configured to receive the count value 317 from counter 316 and compare the count value 317 to one or more thresholds 318, e.g., a first threshold (indicated by "LESS_THR") and second threshold (indicated by "MORE_THR") corresponding to lower and higher threshold values, respectively.

In an example of operation of circuit 300, the 250 kHz clock 302 is synced in the 16 MHz domain (as indicated by CLK_250K_SYNC). The 6-bit counter on the 16 MHz domain can be incremented with every rising edge of the 16 MHz clock 304. The target count can be 32 for a check performed every half of the 250 kHz clock period (i.e., 2 ms). On a rising or falling edge, the counter 316 can be reset and the count can be checked against a first and second thresholds, e.g., COUNTER_LESS (28 or 25, corresponding to −20% and −10%, respectively) and COUNTER_MORE (36 or 39, corresponding to +10% and +20%, respectively), which can be set according to specified values, e.g., on OFE_FAULT_THR. This operation can catch or detect when the 250 kHz clock is stuck, and any clock difference between the 16 MHz and 250 kHz clocks larger than 10% or 20% (depending on set-up). In some examples, the first edges can be masked to avoid false errors.

Figure 4A:
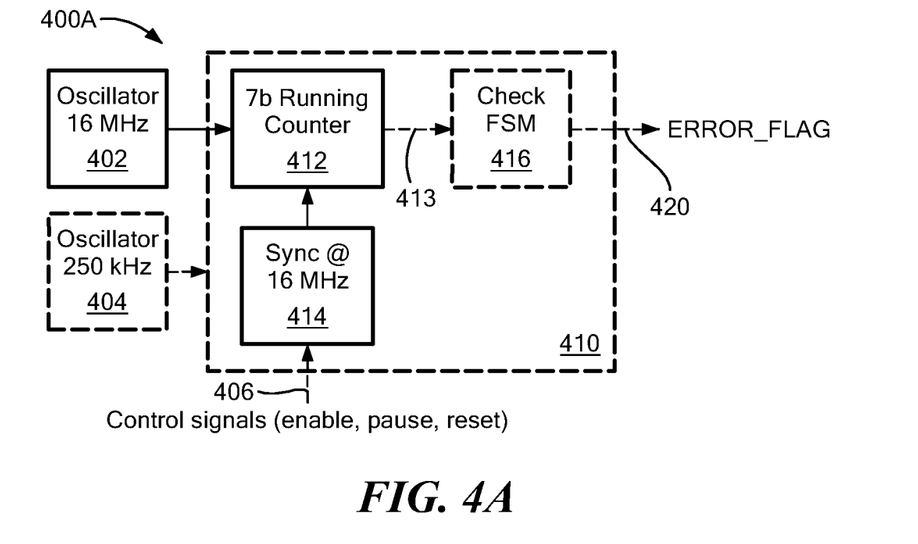
FIG. 4A is a diagram of an example clock monitor circuit implementing a 16 MHz monitor on a 250 kHz domain, in accordance with the present disclosure.

FIG. 4A is a diagram of an example clock monitor circuit 400A implementing a 16 MHz monitor on a 250 KHZ domain, in accordance with the present disclosure. Circuit 400A can include a first oscillator 402 configured for oscillation at a first frequency (e.g., 16 MHz) and a second oscillator 404 configured for oscillation at a second frequency, e.g., 250 kHz. Circuit 400A may include a counter 412, e.g., a seven-bit (7b) counter, configured to receive the output of the first oscillator 402 and produce a corresponding count value 413 as an output. While counter 412 is described as a seven-bit (7b) counter, counter 412 may have a different size (e.g., 8-bit, 6-bit, 4-bit, 10-bit, etc.) in other examples and/or applications. Counter 412 may receive control signals (e.g., pause, reset, enable, etc.) from the 250 kHz domain, as shown.

Clock monitor circuit (a.k.a., "clock monitor") 400A can further include a synchronizer (a.k.a., means for synchronization) 414. As shown, synchronizer 414 may be disposed within or operating at the frequency of the domain of first oscillator 402. In some examples, synchronizer (means for synchronization) 412 can include a MUX synchronizer, a toggle synchronizer, and/or a dual-clock FIFO synchronizer. In the example, counter 412 is synchronized @16 MHz, i.e., to the 16 MHz domain. Clock monitor circuit 400A can also include a finite state machine (FSM) 416 that is configured to receive the count value 413 from counter 412, as shown. FSM 416 can be implemented on or connected to the domain of the second oscillator 404, e.g., the 250 kHz domain. While certain frequencies of oscillations are described for the first and second oscillators 402, 404, the oscillators may have different frequencies of operation in other examples.

Figure 4B:
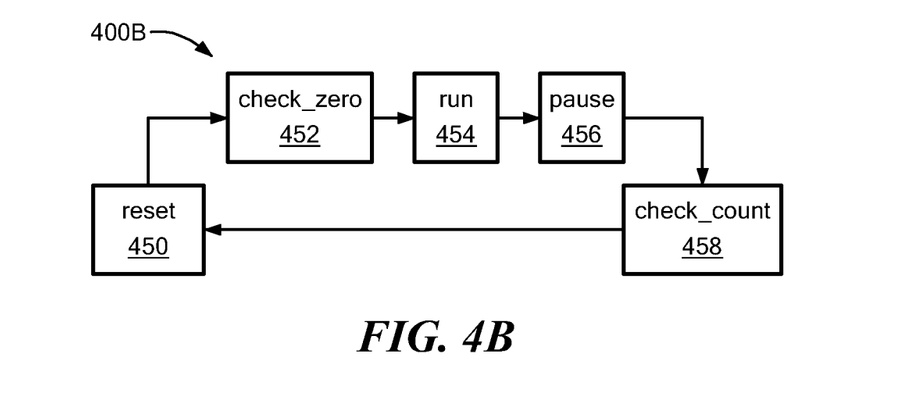
FIG. 4B is a diagram showing an example of operation of a finite state machine used by the clock monitor circuit of FIG. 4A.

FIG. 4B is a diagram showing an example of operation of a finite state machine (FSM) 400B that can be used for the clock monitor circuit in FIG. 4A (e.g., as FSM 416). For the example shown, each state is shown as lasting one 250 kHz clock period (4 ms). In other examples, state duration may be different. If during a zero check, e.g., CHECK_ZERO, the count is not zero or for a count check, e.g., CHECK_COUNT, the count is over a specified threshold (e.g., 71 for 10% allowable error or 77, for 20% allowable error) or below a specified threshold (e.g., 57 for 10% allowable error, or 51 for 20% allowable error), an error can be flagged. For the example shown, the target count can be 64 corresponding to a check performed every 250 kHz clock period (4 ms). This target count can catch the 16 MHz clock 402 being stuck, and the noted thresholds can be used to catch any clock difference between the 16 MHz clock 402 and the 250 kHz clock 404 outside of or beyond the specified thresholds, e.g., +/−10% and/or 20% relative to the target count. The thresholds can be specified on set-up or programmed at set up or during operation.

Figure 5:
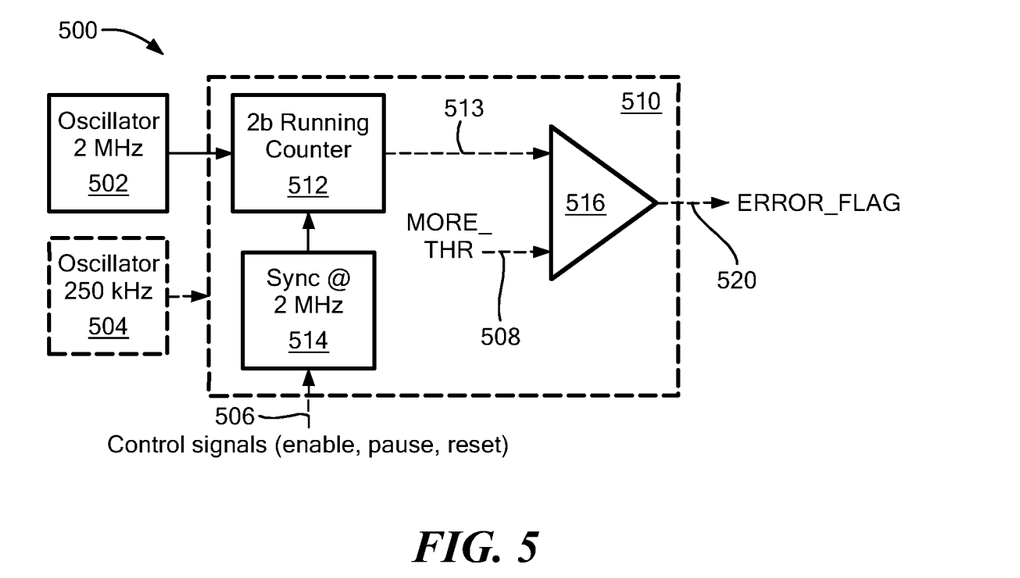
FIG. 5 is a diagram of an example clock monitor circuit implementing a 2 MHz monitor on a 250 kHz domain, in accordance with the present disclosure.

FIG. 5 is a diagram of an example clock monitor circuit 500 implementing a 2 MHz monitor on a 250 kHz domain. Circuit 500 can include a first oscillator 502 configured for oscillation at a first frequency, e.g., 2 MHz, and a second oscillator 504 configured for oscillation at a second frequency, e.g., 250 kHz. Circuit 500 may include a counter 512, e.g., a two-bit (2b) counter, configured to receive the output of the first oscillator 502 and produce a corresponding count value 513 as an output. While counter 512 is described as a two-bit (2b) counter, counter 512 may have a different size (e.g., 8-bit, 7-bit, 4-bit, 10-bit, etc.) in other examples and/or applications. Clock monitor circuit 500 can also include comparator 516 that is configured to receive the count value 513 from counter 512 and compare the count value 513 to a threshold 518, e.g., indicated by "MORE_THR." Clock monitor circuit (a.k.a., "clock monitor") 500 can further include a synchronizer (a.k.a., means for synchronization) 514. As shown, synchronizer 514 may be disposed within or operating at the frequency of the domain of the first oscillator 502. In some examples, synchronizer (means for synchronization) 514 can include a MUX synchronizer, a toggle synchronizer, and/or a dual-clock FIFO synchronizer. In the example, the 2 MHz clock 502 is synchronized @250 kHz, i.e., to the 250 kHz domain. Of course, certain frequencies of oscillations are described for the first and second oscillators 502, 504, the oscillators may have different frequencies of operation in other examples.

Circuit 500 can monitor the 2 MHz oscillator (clock) 502 vs. the 250 kHz oscillator (clock) 504 during certain periods of operation, e.g., during an AWAKE state of (or, used in conjunction with) a Low Power Mode of operation. Circuit 500 can produce an error indication (e.g., error flag) in the event the 2 MHz clock 502 is faster than a specified frequency, e.g., 3.5 MHz.

Figure 6:
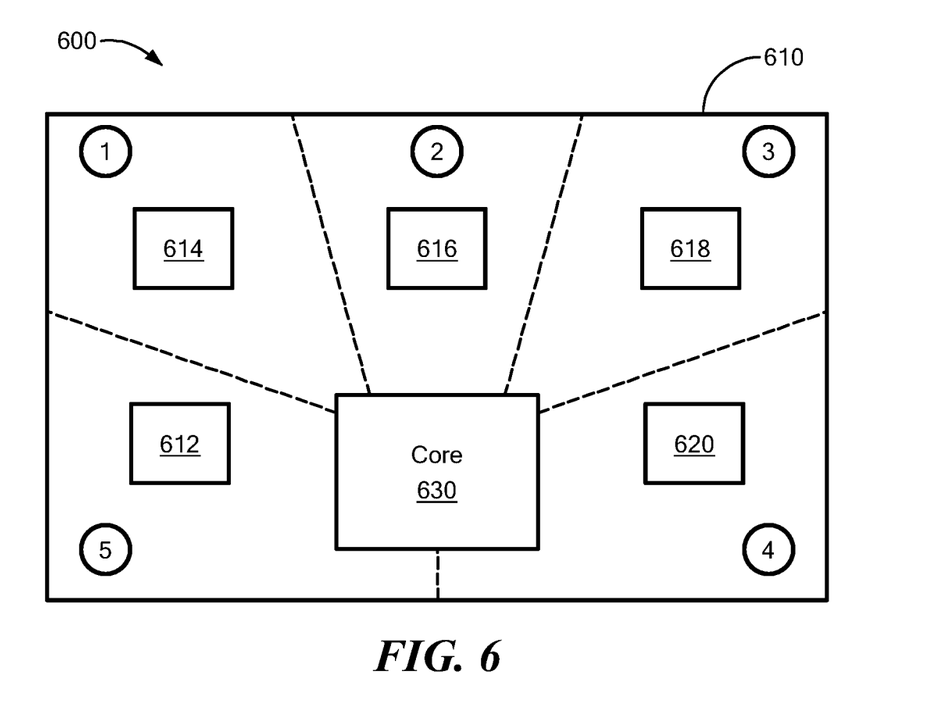
FIG. 6 is a diagram of an example microcontroller implementing multiple clock monitors, in accordance with the present disclosure.

FIG. 6 is a diagram of an example microcontroller 600 utilizing multiple clock monitors, in accordance with the present disclosure. Microcontroller 600 can include multiple oscillator domains, e.g., shown as 1-5, with corresponding clock monitors, e.g., 612, 614, 616, 618, and 620. Microcontroller 600 can further include a core processor (core) 630, which can be connected to or include all or a portion of one or more of the domains 1-5. In some examples the following monitors can be implemented: clock monitor 612 can implement a 2 MHz monitor on a 16 MHz domain, e.g., as described for FIG. 1; clock monitor 614 can implement a 250 kHz monitor on a 2 MHz domain, e.g., as described for FIG. 2; clock monitor 616 can implement a 250 kHZ monitor on a 16 MHz domain, e.g., as described for FIG. 3; clock monitor 618 can implement a 16 MHz monitor on a 250 kHZ domain, e.g., as described for FIG. 4A; and, clock monitor 620 can implement a 2 MHz monitor on a 250 kHz domain, e.g., as described for FIG. 5. While five particular monitors are described for FIG. 6, other examples and embodiments of a microprocessor including clock monitor circuits according to the present disclosure can include fewer or more monitors and the monitors may be configured to monitor clocks having different speeds (frequencies of oscillation).

Figure 7:
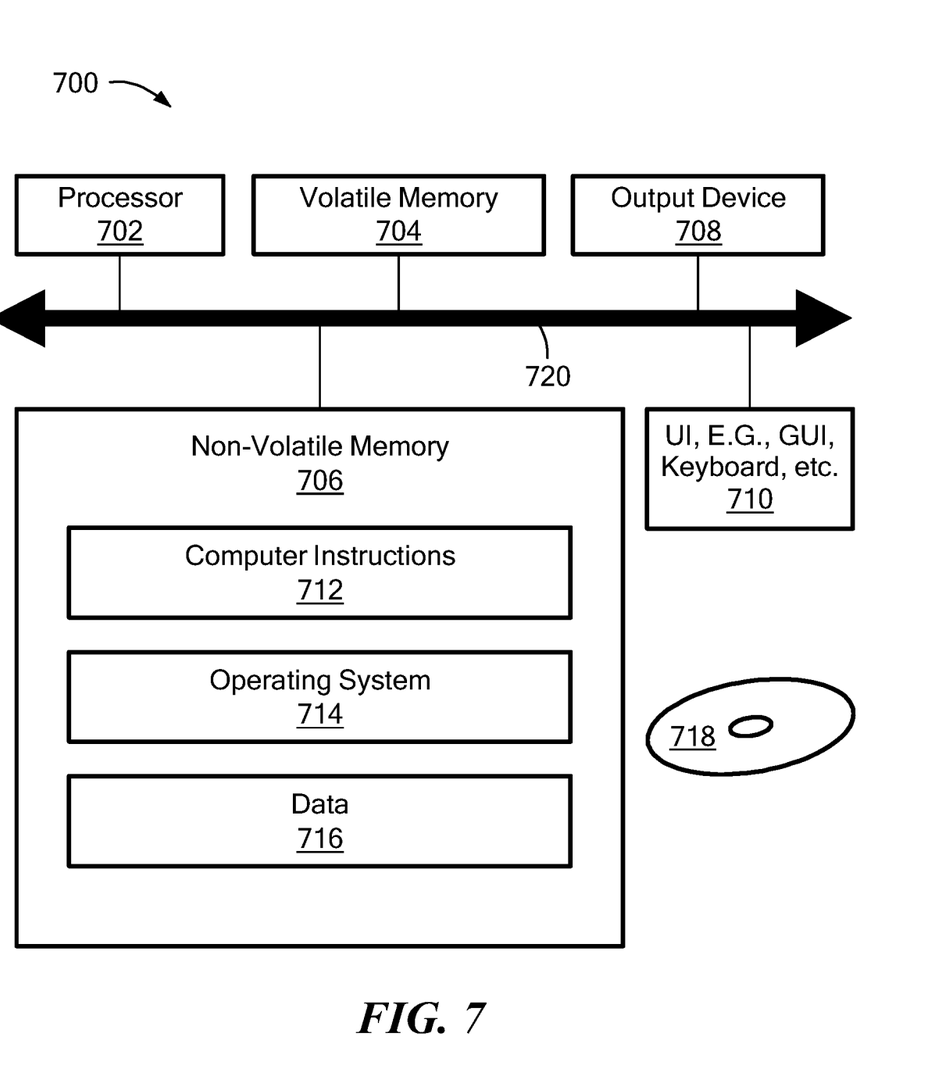
FIG. 7 is a block diagram of an example computer system operative to perform processing, in accordance with the present disclosure.

FIG. 7 is a block diagram of an example computer system 700 operative to perform processing, in accordance with the present disclosure. Computer system 700 can perform all or at least a portion of the processing, e.g., steps in the algorithms and methods, described herein. The computer system 700 includes a processor 702, a volatile memory 704, a non-volatile memory 707 (e.g., hard disk), an output device 708 and a user input or interface (UI) 710, e.g., a graphical user interface (GUI), a mouse, a keyboard, a display, and/or any common user interface, etc. The non-volatile memory (non-transitory storage medium) 706 stores computer instructions 712 (a.k.a., machine-readable instructions or computer-readable instructions) such as software (computer program product), an operating system 714 and data 716. In some examples/embodiments, the computer instructions 712 can be executed by the processor 702 out of (from) volatile memory 704. In some examples/embodiments, an article 718 (e.g., a storage device or medium such as a hard disk, an optical disc, magnetic storage tape, optical storage tape, flash drive, etc.) includes or stores the non-transitory computer-readable instructions. Bus 720 is also shown.

Processing may be implemented in hardware, software, or a combination of the two. Processing may be implemented in computer programs (e.g., software applications) executed on programmable computers/machines that each includes a processor, a storage medium or other article of manufacture that is readable by the processor (including volatile and non-volatile memory and/or storage elements), and optionally at least one input device, and one or more output devices. Program code may be applied to data entered using an input device or input connection (e.g., a port or bus) to perform processing and to generate output information.

The system 700 can perform processing, at least in part, via a computer program product or software application, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. The programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate. Further, the terms "computer" or "computer system" may include reference to plural like terms, unless expressly stated otherwise.

Processing may be performed by one or more programmable processors executing one or more computer programs to perform the functions of the system. All or part of the system may be implemented as, special purpose logic circuitry, e.g., an FPGA (field programmable gate array) and/or an ASIC (application-specific integrated circuit). In some examples, digital logic circuitry, e.g., one or more FPGAs, can be operative as a processor as described herein.

Accordingly, embodiments of the inventive subject matter can afford various benefits relative to prior art techniques. For example, embodiments and examples of the present disclosure can enable or facilitate circuits, components, and systems, including those having clocks and timing circuits and sub-circuits, achieving or obtaining an Application Safety Integration Level (ASIL) in accordance with a safety standard such as ISO 26262.

Various embodiments of the concepts, systems, devices, structures, and techniques sought to be protected are described above with reference to the related drawings. Alternative embodiments can be devised without departing from the scope of the concepts, systems, devices, structures, and techniques described. For example, while oscillators (clocks) are described herein as having particular frequencies of operation, oscillators can have different frequencies of oscillation within the scope of the present disclosure, as a person of ordinary skill in the art will understand. Furthermore, while counters of certain sizes are described herein, counters can have different sizes within the scope of the present disclosure, as a person of ordinary skill in the art will understand.

It is noted that various connections and positional relationships (e.g., over, below, adjacent, etc.) may be used to describe elements and components in the description and drawings. These connections and/or positional relationships, unless specified otherwise, can be direct or indirect, and the described concepts, systems, devices, structures, and techniques are not intended to be limiting in this respect. Accordingly, a coupling of entities can refer to either a direct or an indirect coupling, and a positional relationship between entities can be a direct or indirect positional relationship.

As an example of an indirect positional relationship, positioning element "A" over element "B" can include situations in which one or more intermediate elements (e.g., element "C") is between elements "A" and elements "B" as long as the relevant characteristics and functionalities of elements "A" and "B" are not substantially changed by the intermediate element(s).

Also, the following definitions and abbreviations are to be used for the interpretation of the claims and the specification. The terms "comprise," "comprises," "comprising," "include," "includes," "including," "has," "having," "contains" or "containing," or any other variation are intended to cover a non-exclusive inclusion. For example, an apparatus, a method, a composition, a mixture, or an article, that includes a list of elements is not necessarily limited to only those elements but can include other elements not expressly listed or inherent to such apparatus, method, composition, mixture, or article.

Additionally, the term "exemplary" means "serving as an example, instance, or illustration. Any embodiment or design described as "exemplary" is not necessarily to be construed as preferred or advantageous over other embodiments or designs. The terms "one or more" and "at least one" indicate any integer number greater than or equal to one, i.e., one, two, three, four, etc. The term "plurality" indicates any integer number greater than one. The term "connection" can include an indirect "connection" and a direct "connection".

References in the specification to "embodiments," "one embodiment," "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it may affect such feature, structure, or characteristic in other embodiments whether explicitly described or not.

Relative or positional terms including, but not limited to, the terms "upper," "lower," "right," "left," "vertical," "horizontal, "top," "bottom," and derivatives of those terms relate to the described structures and methods as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another, or a temporal order in which acts of a method are performed, but are used merely as labels to distinguish one claim element having a certain name from another element having a same name (but for use of the ordinal term) to distinguish the claim elements.

The terms "approximately" and "about" may be used to mean within +20% of a target (or nominal) value in some embodiments, within plus or minus (+) 10% of a target value in some embodiments, within +5% of a target value in some embodiments, and yet within +2% of a target value in some embodiments. The terms "approximately" and "about" may include the target value. The term "substantially equal" may be used to refer to values that are within +20% of one another in some embodiments, within +10% of one another in some embodiments, within +5% of one another in some embodiments, and yet within +2% of one another in some embodiments.

The term "substantially" may be used to refer to values that are within +20% of a comparative measure in some embodiments, within +10% in some embodiments, within +5% in some embodiments, and yet within +2% in some embodiments. For example, a first direction that is "substantially" perpendicular to a second direction may refer to a first direction that is within +20% of making a 90° angle with the second direction in some embodiments, within +10% of making a 90° angle with the second direction in some embodiments, within +5% of making a 90° angle with the second direction in some embodiments, and yet within +2% of making a 90° angle with the second direction in some embodiments.

The disclosed subject matter is not limited in its application to the details of construction and to the arrangements of the components set forth in the following description or illustrated in the drawings. The disclosed subject matter is capable of other embodiments and of being practiced and carried out in various ways.

Also, the phraseology and terminology used in this patent are for the purpose of description and should not be regarded as limiting. As such, the conception upon which this disclosure is based may readily be utilized as a basis for the designing of other structures, methods, and systems for carrying out the several purposes of the disclosed subject matter. Therefore, the claims should be regarded as including such equivalent constructions as far as they do not depart from the spirit and scope of the disclosed subject matter.

Although the disclosed subject matter has been described and illustrated in the foregoing exemplary embodiments, the present disclosure has been made only by way of example. Thus, numerous changes in the details of implementation of the disclosed subject matter may be made without departing from the spirit and scope of the disclosed subject matter.

Accordingly, the scope of this patent should not be limited to the described implementations but rather should be limited only by the spirit and scope of the following claims.

All publications and references cited in this patent are expressly incorporated by reference in their entirety.

What is claimed is:

1. A clock monitor for a monitored circuit having a plurality of oscillators, the clock monitor comprising:
   means for synchronization configured to receive a clock signal from a first oscillator of the plurality of oscillators and synchronize the received clock signal with a second oscillator of the plurality of oscillators and to produce a synchronized clock signal;
   a counter configured to produce a count value based on synchronized clock signal; and
   comparison circuitry configured to receive the count value and produce an error indication when the count value is outside a predetermined range;
   wherein the first oscillator is configured to run at a nominal frequency of about 2 MHz and the second oscillator is configured to run at a nominal frequency of about 16 MHZ, wherein the means for synchronization is disposed in a domain of the second oscillator.

2. The clock monitor of claim 1, wherein the comparison circuitry comprises a comparator configured to compare the count value to upper and/or lower threshold values and to determine whether the count value indicates a frequency error.

3. The clock monitor circuit of claim 2, wherein the comparison circuitry is configured to detect the clock signal from the first oscillator being stuck.

4. The clock monitor circuit of claim 2, wherein the comparison circuitry is configured to detect the frequency difference between the two clock signals being outside of a predetermined range.

5. The clock monitor of claim 1, further comprising an edge detector configured to detect transitions between one digital signal state and another state of the synchronized clock signal.

6. The clock monitor of claim 5, wherein the edge detector comprises a rising-edge detector.

7. A clock monitor for a monitored circuit having a plurality of oscillators, the clock monitor comprising:
   means for synchronization configured to receive a clock signal from a first oscillator of the plurality of oscillators and synchronize the received clock signal with a second oscillator of the plurality of oscillators and to produce a synchronized clock signal;
   a counter configured to produce a count value based on synchronized clock signal; and
   comparison circuitry configured to receive the count value and produce an error indication when the count value is outside a predetermined range;
   wherein the first oscillator is configured to run at a nominal frequency of about 250 kHz and the second oscillator is configured to run at a nominal frequency of about 2 MHz, wherein the means for synchronization is disposed in a domain of the second oscillator.

8. A clock monitor for a monitored circuit having a plurality of oscillators, the clock monitor comprising:
   means for synchronization configured to receive a clock signal from a first oscillator of the plurality of oscillators and synchronize the received clock signal with a second oscillator of the plurality of oscillators and to produce a synchronized clock signal;
   a counter configured to produce a count value based on synchronized clock signal; and
   comparison circuitry configured to receive the count value and produce an error indication when the count value is outside a predetermined range;
   wherein the first oscillator is configured to run at a nominal frequency of about 250 kHz and the second oscillator is configured to run at a nominal frequency of about 16 MHz, wherein the means for synchronization is disposed in a domain of the second oscillator.

9. The clock monitor of claim 8, wherein the comparison circuitry comprises a finite state machine (FSM).

10. A clock monitor for a monitored circuit having a plurality of oscillators, the clock monitor comprising:
    means for synchronization configured to receive a clock signal from a first oscillator of the plurality of oscillators and synchronize the received clock signal with a second oscillator of the plurality of oscillators and to produce a synchronized clock signal;
    a counter configured to produce a count value based on synchronized clock signal; and
    comparison circuitry configured to receive the count value and produce an error indication when the count value is outside a predetermined range;
    wherein the first oscillator is configured to run at a nominal frequency of about 2 MHz and the second oscillator is configured to run at a nominal frequency of about 250 kHz, wherein the means for synchronization is disposed in the domain of the second oscillator.

11. The clock monitor of claim 10, wherein the means for synchronization comprises a plurality of flip-flops configured in series.

12. The clock monitor of claim 10, wherein the means for synchronization comprises a MUX synchronizer.

13. The clock monitor of claim 10, wherein the means for synchronization comprises a toggle synchronizer.

14. The clock monitor of claim 10, wherein the means for synchronization comprises a dual-clock FIFO synchronizer.

15. The clock monitor of claim 10, wherein the plurality of oscillators is disposed in an integrated circuit.

16. The clock monitor of claim 10, wherein the comparison circuitry is configured to implement a predetermined range including upper and lower thresholds.

17. The clock monitor of claim 16, wherein the upper and lower thresholds each comprise a pair of different thresholds.

18. A clock monitor circuit for detecting oscillator frequency error in an integrated circuit including a plurality of oscillators, the clock monitor circuit comprising:
    a synchronizer configured to receive a clock signal from a first oscillator of the plurality of oscillators and synchronize the received clock signal with a second oscillator of the plurality of oscillators and to produce a synchronized clock signal;
    a counter configured to produce a count value based on synchronized clock signal; and
    comparison means configured to receive the count value and produce an error indication when the count value is outside a predetermined range;
    wherein the first oscillator is configured to run at a nominal frequency of about 2 MHz and the second oscillator is configured to run at a nominal frequency of about 16 MHz, wherein the synchronizer is disposed in a domain of the second oscillator.

19. The clock monitor circuit of claim 18, wherein the comparison means comprises a comparator configured to compare the count value to upper and/or lower threshold values, to determine whether the count value indicates a frequency error.

20. The clock monitor circuit of claim 18, wherein the comparison circuitry is configured to detect the clock signal from the first oscillator being stuck.

21. The clock monitor circuit of claim 18, wherein the comparison circuitry is configured to detect the frequency difference between the two clock signals being outside of a predetermined range.

22. The clock monitor circuit of claim 18, further comprising an edge detector configured to detect transitions between one digital signal state and another state of the synchronized clock signal.

23. The clock monitor circuit of claim 22, wherein the edge detector comprises a rising-edge detector.

24. A clock monitor circuit for detecting oscillator frequency error in an integrated circuit including a plurality of oscillators, the clock monitor circuit comprising:
a synchronizer configured to receive a clock signal from a first oscillator of the plurality of oscillators and synchronize the received clock signal with a second oscillator of the plurality of oscillators and to produce a synchronized clock signal;
a counter configured to produce a count value based on synchronized clock signal; and
comparison means configured to receive the count value and produce an error indication when the count value is outside a predetermined range;
wherein the first oscillator is configured to run at a nominal frequency of about 250 kHz and the second oscillator is configured to run at a nominal frequency of about 2 MHz, wherein the synchronizer is disposed in a domain of the second oscillator.

25. A clock monitor circuit for detecting oscillator frequency error in an integrated circuit including a plurality of oscillators, the clock monitor circuit comprising:
a synchronizer configured to receive a clock signal from a first oscillator of the plurality of oscillators and synchronize the received clock signal with a second oscillator of the plurality of oscillators and to produce a synchronized clock signal;
a counter configured to produce a count value based on synchronized clock signal; and
comparison means configured to receive the count value and produce an error indication when the count value is outside a predetermined range;
wherein the first oscillator is configured to run at a nominal frequency of about 250 kHz and the second oscillator is configured to run at a nominal frequency of about 16 MHz, wherein the synchronizer is disposed in a domain of the second oscillator.

26. The clock monitor circuit of claim 25, wherein the comparison means comprises a finite state machine (FSM).

27. A clock monitor circuit for detecting oscillator frequency error in an integrated circuit including a plurality of oscillators, the clock monitor circuit comprising:
a synchronizer configured to receive a clock signal from a first oscillator of the plurality of oscillators and synchronize the received clock signal with a second oscillator of the plurality of oscillators and to produce a synchronized clock signal;
a counter configured to produce a count value based on synchronized clock signal; and
comparison means configured to receive the count value and produce an error indication when the count value is outside a predetermined range;
wherein the first oscillator is configured to run at a nominal frequency of about 2 MHz and the second oscillator is configured to run at a nominal frequency of about 250 kHz, wherein the synchronizer is disposed in the domain of the second oscillator.

28. The clock monitor circuit of claim 27, wherein the synchronizer comprises a plurality of flip-flops configured in series.

29. The clock monitor circuit of claim 27, wherein the synchronizer comprises a MUX synchronizer.

30. The clock monitor circuit of claim 27, wherein the synchronizer comprises a toggle synchronizer.

31. The clock monitor circuit of claim 27, wherein the synchronizer comprises a dual-clock FIFO synchronizer.

32. The clock monitor circuit of claim 27, wherein the comparison means is configured to implement a predetermined range including upper and lower thresholds.

33. The clock monitor circuit of claim 32, wherein the upper and lower thresholds each comprise a pair of different thresholds.

34. The clock monitor circuit of claim 27, wherein the clock monitor circuit comprises a microcontroller.

* * * * *

UNITED STATES PATENT AND TRADEMARK OFFICE
CERTIFICATE OF CORRECTION

PATENT NO. : 12,063,046 B2
APPLICATION NO. : 18/063809
DATED : August 13, 2024
INVENTOR(S) : Florencia Ferrer et al.

It is certified that error appears in the above-identified patent and that said Letters Patent is hereby corrected as shown below:

In the Specification

Column 6, Line 12, delete "50 us" and replace with --50 µs--.

Column 6, Line 26, delete "12 us" and replace with --12 µs--.

Column 7, Line 16, delete "40 us" and replace with --40 µs--.

Column 12, Line 18, delete "+20%" and replace with --±20%--.

Column 12, Line 19, delete "(+)10%" and replace with --(±)10%--.

Column 12, Line 20, delete "+5%" and replace with --±5%--.

Column 12, Line 21, delete "+2%" and replace with --±2%--.

Column 12, Line 24, delete "+20%" and replace with --±20%--.

Column 12, Line 25, delete "+10%" and replace with --±10%--.

Column 12, Line 26, delete "+5%" and replace with --±5%--.

Column 12, Line 27, delete "+2%" and replace with --±2%--.

Column 12, Line 30, delete "+20%" and replace with --±20%--.

Column 12, Line 31, delete "+10%" and replace with --±10%--.

Column 12, Line 32, delete "+5%" and replace with --±5%--.

Signed and Sealed this
Fourth Day of February, 2025

Coke Morgan Stewart
*Acting Director of the United States Patent and Trademark Office*

CERTIFICATE OF CORRECTION (continued)
U.S. Pat. No. 12,063,046 B2

Column 12, Line 32, delete "+2%" and replace with --±2%--.

Column 12, Line 35, delete "+20%" and replace with --±20%--.

Column 12, Line 37, delete "+10%" and replace with --±10%--.

Column 12, Line 38, delete "+5%" and replace with --±5%--.

Column 12, Line 40, delete "+2%" and replace with --±2%--.